(12) United States Patent
Sato

(10) Patent No.: US 6,700,378 B2
(45) Date of Patent: Mar. 2, 2004

(54) MAGNETIC RESONANCE IMAGING COIL STRUCTURE HAVING REDUCED TOLERANCE

(75) Inventor: Kenji Sato, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/119,788

(22) Filed: Apr. 10, 2002

(65) Prior Publication Data

US 2002/0167320 A1 Nov. 14, 2002

(30) Foreign Application Priority Data

May 10, 2001 (JP) .......................... 2001-140310

(51) Int. Cl.[7] ................................ G01N 3/00
(52) U.S. Cl. ................................... 324/318
(58) Field of Search ............... 324/318, 322, 324/307, 309

(56) References Cited

U.S. PATENT DOCUMENTS

| | | |
|---|---|---|
| 4,680,551 A | 7/1987 | O'Donnell et al. |
| 4,682,112 A | 7/1987 | Beer |
| 4,720,679 A | 1/1988 | Patrick et al. |
| 4,740,753 A | 4/1988 | Glover et al. |
| 4,761,614 A | 8/1988 | Prammer et al. |
| 4,899,109 A | 2/1990 | Tropp et al. |
| 4,905,316 A * | 2/1990 | Okamoto ................ 324/319 |
| 5,250,901 A | 10/1993 | Kaufman et al. |
| 5,396,173 A * | 3/1995 | Sakakura et al. ........ 324/318 |
| 5,400,786 A | 3/1995 | Allis |
| 5,414,399 A | 5/1995 | Breneman et al. |
| 5,489,848 A * | 2/1996 | Furukawa ............... 324/318 |
| 5,614,880 A * | 3/1997 | Palkovich et al. ....... 335/299 |
| 5,630,415 A * | 5/1997 | Kaufman ................ 600/422 |
| 5,633,588 A * | 5/1997 | Hommei et al. ......... 324/320 |
| 5,635,839 A * | 6/1997 | Srivastava et al. ...... 324/320 |
| 5,729,141 A * | 3/1998 | Hass et al. ............. 324/318 |
| 5,864,275 A * | 1/1999 | Ohashi et al. .......... 335/306 |
| 6,163,240 A | 12/2000 | Zuk et al. |
| 6,201,394 B1 | 3/2001 | Danby et al. |
| 6,249,121 B1 * | 6/2001 | Boskamp et al. ........ 324/318 |
| 6,275,128 B1 | 8/2001 | Aoki et al. |
| 6,275,129 B1 * | 8/2001 | van Oort ............... 335/301 |
| 6,285,188 B1 * | 9/2001 | Sakakura ............... 324/318 |
| 6,326,788 B1 * | 12/2001 | Mulder et al. .......... 324/318 |
| 6,326,789 B1 | 12/2001 | Yoshida et al. |
| 6,333,630 B1 | 12/2001 | Holsinger et al. |
| 6,342,787 B1 * | 1/2002 | Petropoulos et al. .... 324/320 |
| 6,348,794 B1 | 2/2002 | Nabetani et al. |
| 6,362,623 B1 * | 3/2002 | Goto .................... 324/318 |
| 6,437,568 B1 * | 8/2002 | Edelstein et al. ....... 324/318 |
| 6,489,765 B2 * | 12/2002 | Goto .................... 324/307 |
| 6,498,488 B2 * | 12/2002 | Takeshima et al. ...... 324/318 |
| 6,567,685 B2 * | 5/2003 | Takamori et al. ....... 600/410 |

FOREIGN PATENT DOCUMENTS

JP  0035944  * 2/1999

* cited by examiner

Primary Examiner—Diego Gutierrez
Assistant Examiner—Dixonmara Vargas
(74) Attorney, Agent, or Firm—Carl B. Horton, Esq.; Armstrong Teasdale LLP

(57) ABSTRACT

A magnetic resonance imaging coil structure includes a main magnetic field generating magnet, a gradient magnetic field generating coil, a shield, a magnetic field correcting shim plate and a transmission coil stacked in this order. At least the shield and the transmission coil are integrally formed with a joint portion made of a material including FRP that maintains a constant distance between the shield and the transmission coil.

9 Claims, 5 Drawing Sheets

MAGNETIC RESONANCE IMAGING COIL STRUCTURE HAVING REDUCED TOLERANCE

CROSS REFERENCE TO RELATED APPLICATIONS

This application claims the benefit of the Japanese Application No. 2001-140310 filed May 10, 2,001.

BACKGROUND OF THE INVENTION

The present invention relates to a magnetic resonance imaging (MRI) coil structure and a magnetic resonance imaging apparatus employing the coil structure, and particularly to a magnetic resonance imaging coil structure comprising a main magnetic field generating magnet, a gradient magnetic field generating coil, a shield, a magnetic field correcting shim plate and a transmission coil stacked in this order.

In recent years, magnetic resonance imaging apparatuses (MRI apparatuses) have attracted attention for their ability to provide tomographic images of a subject, such as the human body. In the MRI apparatuses, the magnetic property of hydrogen atomic nuclei (protons) within the subject is used and therefore a strong, homogeneous and stable magnetic field is generated.

The MRI apparatuses have employed a superconductive magnet to generate a main magnetic field. However, in using such a superconductive magnet, liquid helium is employed to attain the cryogenic state for realizing the superconductive state. MRI apparatuses that employ a permanent magnet, use no liquid helium, and have excellent openness to mitigate claustrophobic feeling experienced by the subject are coming into widespread use.

The MRI apparatuses employing the permanent magnet are configured to position the subject in a magnetic field space formed between a pair of magnetic resonance imaging coil structures disposed facing each other, and obtain a tomographic image of the subject. The coil structure is constructed by stacking a main magnetic field generating magnet (permanent magnet), a gradient magnetic field generating coil, a shield, a magnetic field correcting shim plate and a transmission coil in this order. Over the transmission coil, it is common to stack a cover made of a material like FRP.

The magnetic resonance imaging coil structure is constructed by sequentially stacking and assembling the main magnetic field generating magnet, gradient magnetic field generating coil, shield, magnetic field correcting shim plate and transmission coil that have been separately formed.

In such a magnetic resonance imaging coil structure, the distance (separation) between the shield and transmission coil must be controlled with a good accuracy. This is conducted because error in the distance causes an increase in the frequency shift and the error significantly affects the image quality of the resulting tomographic image. As an example, if the distance between the shield and transmission coil is generally about 20 mm, a tolerance of the order of 1 mm arises in practice during the aforementioned assembling and the amount of frequency shift due to the tolerance of 1 mm is about 100 kHz.

For this reason, a smaller tolerance of the distance between the shield and transmission coil is preferred. In a trial and error process, a plurality of alternative shim plates configured to be located between the shield and transmission coil are inserted or removed for correcting the magnetic field to adjust spatial homogeneity of the main magnetic field generated by the main magnetic field generating magnet. However, the tolerance of the thickness of the shim plate itself affects the distance between the shield and transmission coil, thus making it difficult to reduce the current tolerance.

It is desirable to reduce the tolerance under the present circumstances where further improvement of the image quality is desired.

SUMMARY OF THE INVENTION

It is therefore an object of the present invention to provide a magnetic resonance imaging coil structure in which the tolerance of the distance between the shield and transmission coil can be reduced to reduce the amount of frequency shift, and a magnetic resonance imaging apparatus employing such a coil structure.

In its first aspect, the present invention provides a magnetic resonance imaging coil structure including a main magnetic field generating magnet, a gradient magnetic field generating coil, a shield, a magnetic field correcting shim plate and a transmission coil stacked in this order, characterized in that at least the shield and the transmission coil are integrally formed.

The phrase "at least a shield and a transmission coil are integrally formed" as used herein means that in a coil structure in which the shield and the transmission coil are integrally formed, the main magnetic field generating magnet and gradient magnetic field generating coil may be additionally integrally formed.

To be integrally formed, the distance between the shield and the transmission coil contains the tolerance during formation and is not affected by the tolerance of the magnetic field correcting shim plate positioned between the shield and transmission coil. Thus, the tolerance of the distance between the shield and transmission coil can be reduced relative to the tolerance of the distance between the shield and transmission coil in a conventional magnetic resonance imaging coil structure that is assembled by stacking the shield, magnetic field correcting shim plate and transmission coil. Consequently, the image quality of resulting tomographic images can be improved relative to the conventional ones. In addition, the adjustment work for correcting the amount of frequency shift cart be significantly reduced since the amount of frequency shift is reduced. For example, actual results achieved by the present inventors show that when the distance between the shield and transmission coil is 20 mm, the tolerance of the distance is of the order of 0.5 mm, which has been reduced by about half as compared to the conventional tolerance (about 1 mm). The thus-reduced tolerance results in a frequency shift of about 40 kHz. Moreover, the required RF power can also be reduced.

In its second aspect, the present invention provides a magnetic resonance imaging coil structure characterized in that a shim plate space is formed between the shield and transmission coil. The shim plate space is a space into which the magnetic field correcting shim plate can be inserted from the outer peripheral side. The shim plate space is also a space from which the magnetic field correcting shim plate can be removed from the outer peripheral side. The term "outer peripheral side" as used herein refers to the outside of the shield and transmission coil in a plane orthogonal to the stacking direction of the shield and transmission coil.

A trial and error process of inserting/removing the magnetic field correcting shim plate can be made easy since the magnetic field correcting shim plate can be arbitrarily and separately inserted from the outer peripheral side into the shim plate space formed between the shield and transmission coil. Moreover, the magnetic field correcting shim plate can be arbitrarily and separately removed from the outer peripheral side from the shim plate space formed between the shield and transmission coil.

In its third aspect, the present invention provides a magnetic resonance imaging coil structure, characterized in that the magnetic field correcting shim plate is divided into a plurality of generally lath-shaped portions, and the shim plate space is formed as tubular cavities into/from which the magnetic field correcting shim plate can be individually or removed from the outer peripheral side. The magnetic field correcting shim plate is divided into the lath-shaped portions.

The division of the magnetic field correcting shim plate into a plurality of lath-shaped portions reduces the work of inserting into or withdrawing from the shim plate space, an undivided large integral magnetic field correcting shim plate. When inhomogeneity of the main magnetic field is to be corrected, a lath-shaped portion corresponding to the inhomogeneous space may be replaced.

In its fourth aspect, the present invention provides a magnetic resonance imaging coil structure, characterized in that the magnetic field correcting shim plate is divided into a plurality of generally fan-shaped portions and the shim plate space is formed as tubular cavities into which the magnetic field correcting shim plate divided into the fan-shaped portions can be individually inserted from the outer peripheral side. The shim plate space is also formed of tubular cavities from which the magnetic field correcting shim plate divided into the fan-shaped portions can be individually removed from the outer peripheral side.

The division of the magnetic field correcting shim plate into a plurality of fan-shaped portions reduces the work of inserting into or withdrawing from the shim plate space, an undivided large integral magnetic field correcting shim plate. When inhomogeneity of the main magnetic field is to be corrected, a lath-shaped portion corresponding to the inhomogeneous space may be replaced.

In its fifth aspect, the present invention provides a magnetic resonance imaging coil structure including a fixing ring for covering the outer periphery of the magnetic field correcting shim plate. The fixing ring is joined and fixed to the outer peripheral surface of the magnetic field correcting shim plate.

The fixing ring prevents the magnetic field correcting shim plate from coming out of the shim plate space, and from unexpectedly moving in the shim plate space.

In its sixth aspect, the present invention provides a magnetic resonance imaging coil structure including a plurality of fixing straps for joining and fixing the outer peripheral surfaces of the adjacent divided portions, such as the lath-shaped or the fan-shaped portions, of the magnetic field correcting shim plate.

The fixing straps integrally joins and fixes, as a whole, the magnetic field correcting shim plate on its outer peripheral surface, prevents the divided portions of the magnetic field correcting shim plate from coming out of the shim plate space, and securely prevents the undivided portions from unexpectedly moving in the shim plate space.

In its seventh aspect, the present invention provides a magnetic resonance imaging coil structure, characterized in that each divided portion of the magnetic field correcting shim plate is locked by a frictional force between at least part of the outer surface of the divided portion, such as the lath-shaped portion or the fan-shaped portion, and the inner wall of the tubular cavity.

The frictional force prevents each divided portion of the magnetic field correcting shim plate from coming out of the shim plate space in which that divided portion is received. Moreover, the frictional force prevents each divided portion of the plate from unexpectedly moving in the shim plate space.

In its eighth aspect, the present invention provides a magnetic resonance imaging coil structure characterized in that a maximum tolerance of the distance between the shield and transmission coil is ±0.5 mm. The tolerance is reduced relative to a conventional tolerance of the distance of ±1.0 mm and the amount of frequency shift can be reduced generally by half.

In its ninth aspect, the present invention provides a magnetic resonance imaging apparatus including two magnetic resonance imaging coil structures disposed facing each other across a space for positioning a subject.

Hence, the magnetic resonance imaging apparatus improves the image quality of resulting tomographic images relative to the conventional ones. The image quality is improved since the amount of frequency shift is reduced, the adjustment work for correcting the amount of frequency shift is significantly reduced, and the required RF power is reduced, and the like.

So, according to the magnetic resonance imaging coil structure and the magnetic resonance imaging apparatus employing the magnetic resonance imaging coil structure of the present invention, the following effects can be afforded:

First, since at least the shield and the transmission coil are integrally formed, the distance between them only contains the tolerance during formation and is not affected by the tolerance of the magnetic field correcting shim plate positioned between the shield and transmission coil. Thus, the tolerance of the distance between the shield and transmission coil can be reduced relative to the conventional tolerance of the distance between the shield and transmission coil in a conventional magnetic resonance imaging coil structure that is assembled by stacking the shield, magnetic field correcting shim plate and transmission coil. Consequently, the image quality of resulting tomographic images can be improved relative to the conventional ones. In addition, since the amount of frequency shift is reduced, the adjustment work for correcting the amount of frequency shift can be significantly reduced. Moreover, the required RF power can also be reduced.

Second, the magnetic field correcting shim plate is formed as divided into a plurality of generally lath- or fan-shaped portions, and the shim plate space is formed as tubular cavities into which the magnetic field correcting shim plate divided into the lath- or fan-shaped portions can be individually inserted from the outer peripheral side. The shim plate space is also formed as tubular cavities from which the magnetic field correcting shim plate divided into the lath- or fan-shaped portions can be individually withdrawn from the outer peripheral side. Therefore, when inhomogeneity of the main magnetic field is corrected, only the lath- or fan-shaped portion corresponding to the inhomogeneous space can be replaced. Thus, the work is reduced relative to that when an undivided large integral magnetic field correcting shim plate is as a whole inserted into or withdrawn from the shim plate space.

Further objects and advantages of the present invention will be apparent from the following description of the preferred embodiments of the invention as illustrated in the accompanying drawings.

DETAILED DESCRIPTION OF THE DRAWINGS

Embodiments of the magnetic resonance imaging coil structure in accordance with the present invention and the magnetic resonance imaging (MRI) apparatus of the present invention employing the coil structure will now be described with reference to the accompanying drawings. However, the present invention is not limited by these embodiments.

Figure 1:
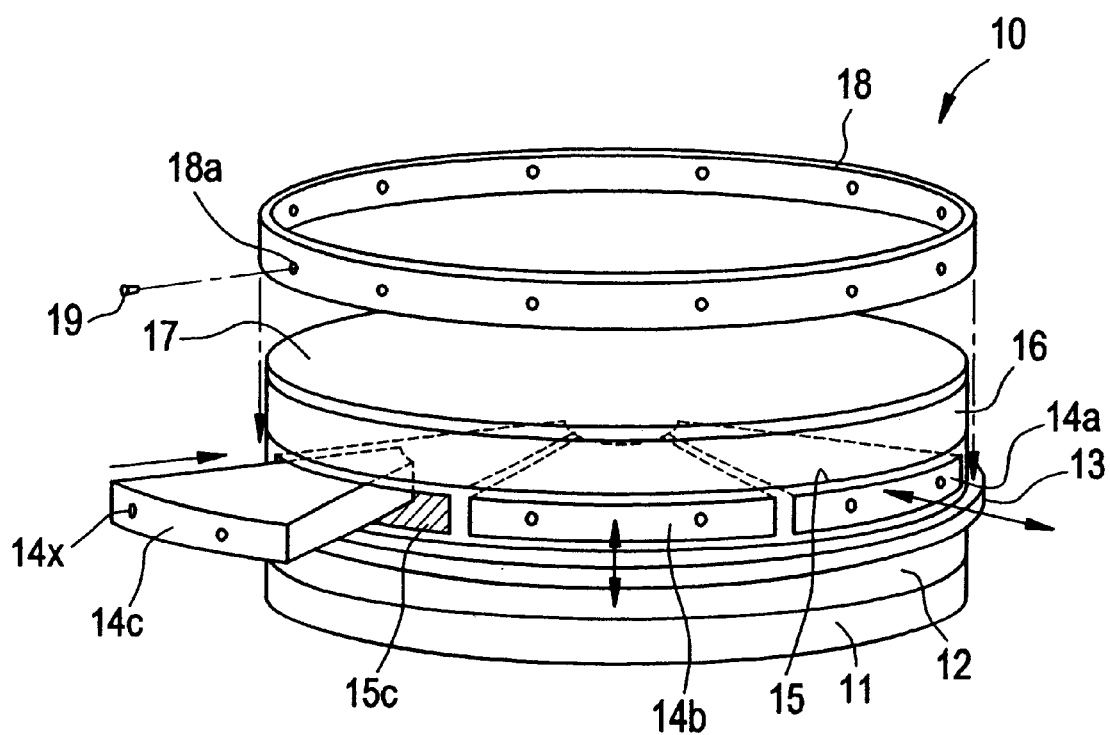
FIG. 1 shows a magnetic resonance imaging coil structure that is an embodiment of the present invention.
Figure 2:
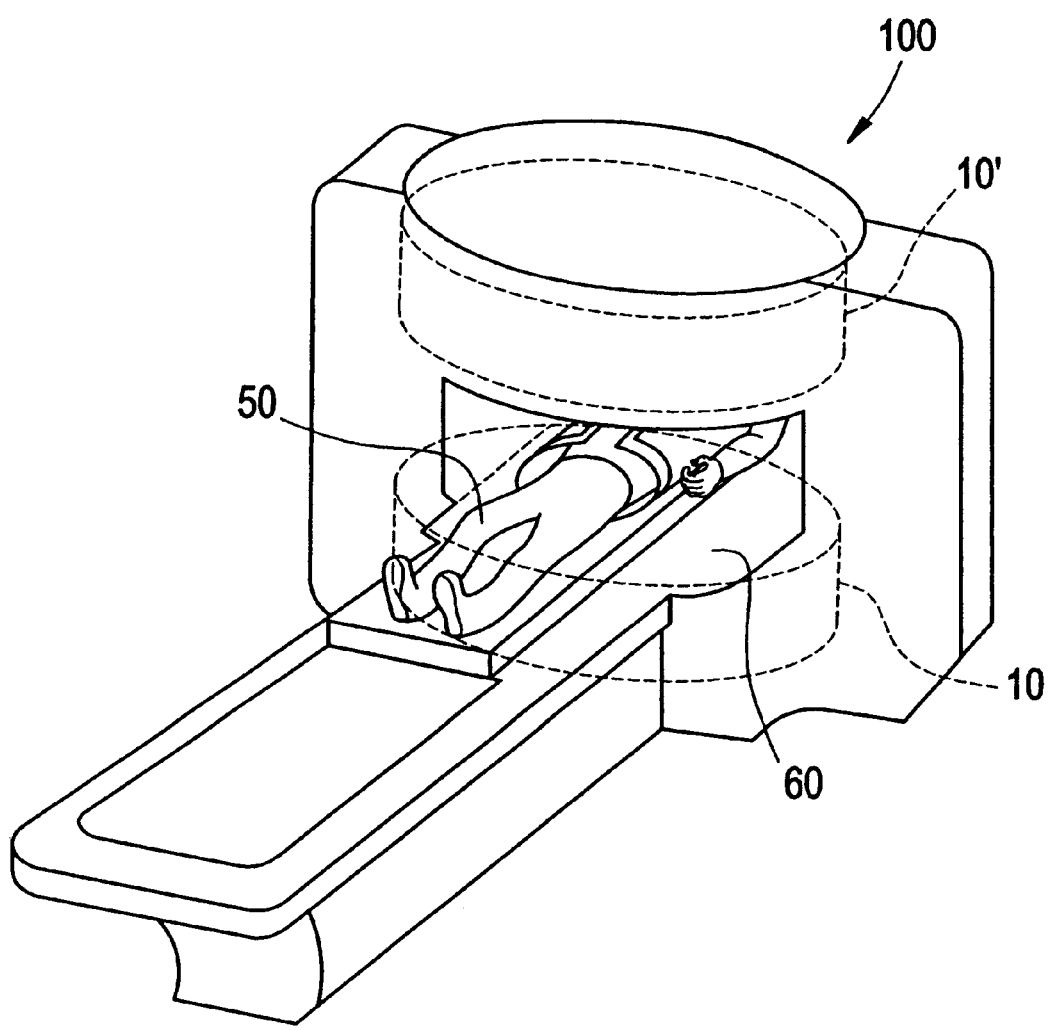
FIG. 2 shows a vertical magnetic field type MRI apparatus employing the magnetic resonance imaging coil structure shown in FIG. 1, which apparatus is an embodiment of the present invention.

FIG. 1 shows one embodiment of a magnetic resonance imaging coil structure 10 of the present invention and FIG. 2 shows an exterior view of a vertical magnetic field type MRI apparatus 100 employing magnetic resonance imaging coil structure 10. To generate a magnetic field for the MRI apparatus 100 shown in FIG. 2, a pair of magnetic resonance imaging coil structures 10 and 10' are disposed across a space 60 for positioning a subject 50. Magnetic resonance imaging coil structure 10 and 10' face each other.

Magnetic resonance imaging coil structure 10' disposed above subject 50 has the same configuration as magnetic resonance imaging coil structure 10 (see FIG. 1) disposed below subject 50, except that the former one is inverted in the upper-lower (top-bottom) direction.

In the illustrated magnetic resonance imaging coil structure 10, a main magnetic field generating magnet 11, a gradient magnetic field generating coil 12, a shield 13, a magnetic field correcting shim plate 14 (14a, 14b, 14c, . . . ), a transmission coil 16 and a cover 17 are stacked from the bottom.

Shield 13 and transmission coil 16 are integrally formed with a joint portion 15 made of FRP that maintains a constant distance between shield 13 and transmission coil 16. Magnetic field correcting shim plate 14 includes six fan-shaped portions 14a, 14b, 14c, . . . obtained by radially dividing a generally disk-shaped magnetic field correcting shim plate, as shown. Fan-shaped portions 14a, 14b, 14c, . . . are received in respective tubular cavities 15c formed in joint portion 15, each of which is an internal space having the same shape as that of fan-shaped portions 14a, 14b, 14c, . . .

Moreover, fan-shaped portions 14a, 14b, 14c, . . . of magnetic field correcting shim plate 14 are configured so that they can be inserted into or withdrawn from respective tubular cavities 15c from the outer peripheral side, as indicated by arrows in the drawing, to allow suitable replacement with at least one of a plurality of alternative fan-shaped portions of the magnetic field correcting shim plate. The outer peripheral surface of each fan-shaped portion 14a, 14b, 14c, which is an arcuate face, is provided with a threaded hole 14x, and threaded hole 14x can receive a screw 19 via a hole 18a through a fixing ring 18, which will be described below.

Fixing ring 18 prevents fan-shaped portions 14a, 14b, 14c, . . . of magnetic field correcting shim plate 14 from coming out of respective tubular cavities 15c. To prevent fan-shaped portions 14a, 14b, 14c, . . . from coming out, the inner peripheral surface of fixing ring 18 abuts the outer peripheral surface of fan-shaped portions 14a, 14b, 14c, . . . and covers the surface. Fixing ring 18 abuts and covers the outer peripheral surface once fan-shaped portions 14a, 14b, 14c, . . . are received in respective tubular cavities 15c. Fixing ring 18 is also provided with hole 18a at positions corresponding to threaded holes 14x formed on the outer peripheral surfaces of fan-shaped portions 14a, 14b, 14c, . . . Fixing ring 18 is joined and fixed with fan-shaped portions 14a, 14b, 14c, . . . by using at least one screw, such as, screw 19.

Since shield 13 and transmission coil 16 are integrally formed with joint portion 15, the distance between shield 13 and transmission coil 16 only contains the tolerance during formation and is not affected by the tolerance of the thickness of magnetic field correcting shim plate 14 positioned between shield 13 and transmission coil 16. Thus, the tolerance of the distance between shield 13 and transmission coil 16 can be reduced relative to the conventional tolerance. For example, if the conventional tolerance is ±1.0 mm, the tolerance in this embodiment is reduced to ±0.5 mm.

Consequently, the image quality of tomographic images obtained by MRI apparatus 100 can be improved relative to conventional ones. Moreover, the adjustment work for correcting the amount of frequency shift can be significantly reduced since the amount of frequency shift is reduced. The amount of the frequency shift is reduced due to the reduction in the tolerance. Additionally, the required RF power can be reduced.

Figure 3:
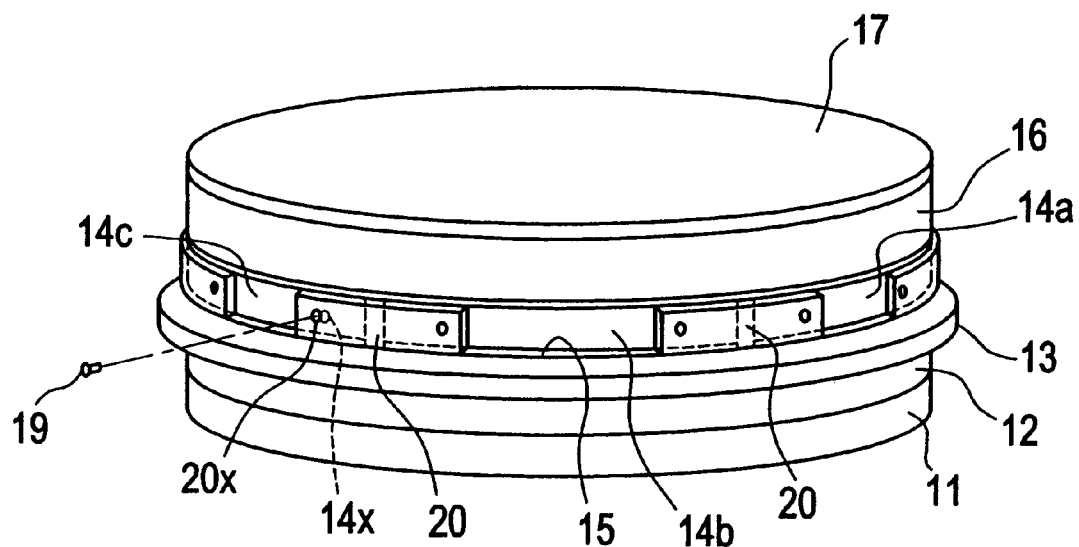
FIG. 3 shows a joining and fixing method using fixing straps.

While coil structure 10 of the embodiment shown in FIG. 1 is configured to employ fixing ring 18 for joining and fixing fan-shaped portions 14a, 14b, 14c, . . . of magnetic field correcting shim plate 14, the present invention is not limited to such an embodiment. As exemplarily shown in FIG. 3, coil structure 10 may be configured to comprise six fixing straps 20, instead of the fixing ring 18, which join and fix the outer peripheral surfaces of the adjacent fan-shaped portions (for example, 14a and 14b, 14b and 14c, etc.) when fan-shaped portions 14a, 14b, 14c, . . . are received in the tubular cavities 15c. Each fixing strap 20 is provided with a hole 20x, as in fixing ring 18, at a position corresponding to threaded hole 14x of adjacent fan-shaped portions 14a, 14b, 14c, . . . , for joining and fixing adjacent fan-shaped portions (14a and 14b, 14b and 14c, etc.) by fixing straps 20 via screw 19. Such a fixing method can afford the same effect as in the embodiment described above (FIG. 1).

Figure 4:
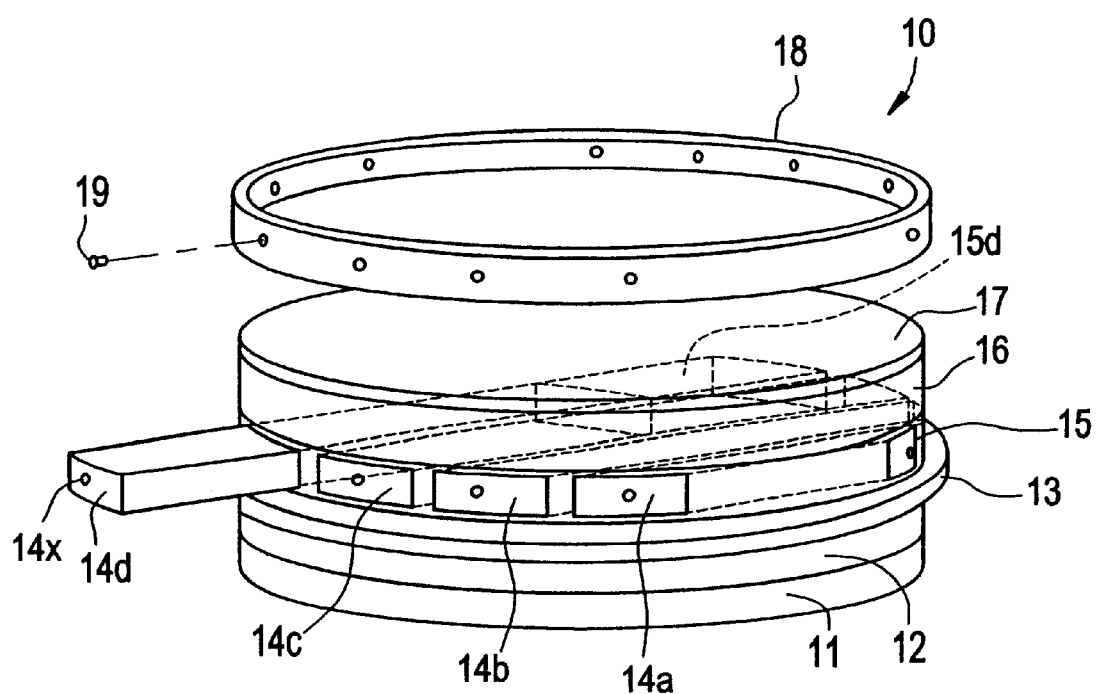
FIG. 4 shows a magnetic resonance imaging coil structure employing a magnetic field correcting shim plate that is divided into lath-shaped portions.

Moreover, magnetic field correcting shim plate 14 is not limited to one that is divided into the fan-shaped portions 14a, 14b, 14c, . . . as described above. As shown in FIG. 4, magnetic field correcting shim plate 14 that is divided into elongated columnar lath-shaped portions 14a, 14b, 14c, 14d, . . . may be applied. In this case, tubular cavities 15d formed in joint portion 15 are formed corresponding to lath-shaped portions 14a, 14b, 14c, 14d, . . . , as an internal space having the same shape as that of lath-shaped portions 14a, 14b, 14c, 14d, . . . . Such a divided form can afford the same effect as in the embodiment described above (FIG. 1).

Figure 5:
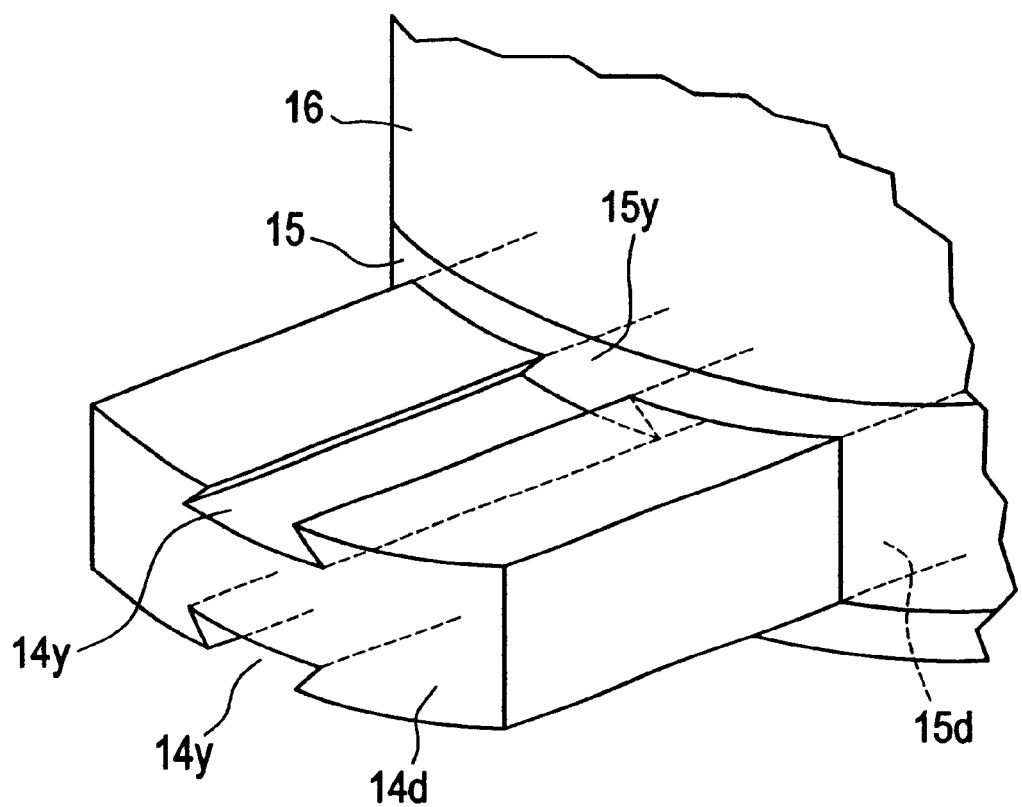
FIG. 5 shows an embodiment in which a frictional force between a guide rail and a guide groove prevents the lath-shaped portion from coming out of a shim space.

Also in the case of lath-shaped portions 14a, 14b, 14c, 14d, . . . , the joining and fixing method is not limited to that using fixing ring 18. Fixing straps 20 shown in FIG. 3 may be employed for the joining and fixing. In an alternative embodiment, as shown in FIG. 5, a protruding guide rail 15y having a generally Ω-shaped cross section may be formed on a wall of tubular cavity 15c; on the other hand, a guide groove 14y that engages with guide rail 15y may be formed on each lath-shaped portion 14a, 14b, 14c, 14d, . . . ; so that a coefficient of static friction is established between guide rail 15y and guide groove 14y. The coefficient of static friction is such that lath-shaped portions 14a, 14b, 14c, 14d, . . . do not easily come out of tubular cavities 15d, to thereby prevent lath-shaped portions 14a, 14b, 14c, 14d, . . . from coming out. It is noted that lath-shaped portion 14a, 14b, 14c, 14d, . . . are prevented from easily coming out without providing special fixing means, such as fixing ring 18 and fixing straps 20.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging coil structure comprising a main magnetic field generating magnet, a gradient magnetic field generating coil, a shield, a magnetic field correcting shim plate and a transmission coil stacked in this order, characterized in that:

at least said shield and said transmission coil are integrally formed with a joint portion made of a material including fiberglass-reinforced plastic (FRP) that maintains a constant distance between said shield and said transmission coil.

2. The magnetic resonance imaging coil structure in accordance with claim 1, wherein a shim plate space into which said magnetic field correcting shim plate can be inserted from the outer peripheral side is formed between said shield and said transmission coil, said shim plate space from which said magnetic field correcting shim plate can be removed from the outer peripheral side is formed between said shield and said transmission coil.

3. The magnetic resonance imaging coil structure in accordance with claim 2, wherein said magnetic field correcting shim plate is formed of a plurality of generally lath-shaped portions, said shim plate space is formed of tubular cavities into which said lath-shaped portions can be individually inserted from the outer peripheral side, and said shim plate space is formed of tubular cavities from which said lath-shaped portions can be individually removed from the outer peripheral side.

4. The magnetic resonance imaging coil structure in accordance with claim 2, wherein said magnetic field correcting shim plate is formed of a plurality of generally fan-shaped portions, said shim plate space is formed of tubular cavities into which said fan-shaped portions can be individually inserted from the outer peripheral side, said shim plate space is formed of tubular cavities from which said fan-shaped portions can be individually removed from the outer peripheral side.

5. The magnetic resonance imaging coil structure in accordance claim 1 further comprising, with said magnetic field correcting shim plate received in said shim plate space, a fixing ring for covering the outer periphery of said magnetic field correcting shim plate, wherein said fixing ring is joined and fixed to the outer peripheral surface of said magnetic field correcting shim plate.

6. The magnetic resonance imaging coil structure in accordance with claim 1 further comprising, with said magnetic field correcting shim plate received in said shim plate space, a plurality of fixing straps for joining and fixing the outer peripheral surfaces of adjacent shim plate portions of said magnetic field correcting shim plate.

7. The magnetic resonance imaging coil structure in accordance with claim 1, wherein each shim plate portion of said magnetic field correcting shim plate is locked by a frictional force between at least part of the outer surface of said shim plate portion and the inner wall of a tubular cavity of a shim plate space in which said shim plate portion is received.

8. The magnetic resonance imaging coil structure in accordance with claim 1, wherein a maximum tolerance of the distance between said shield and said transmission coil is ±0.5 mm.

9. A magnetic resonance imaging apparatus comprising two magnetic resonance imaging coil structures in accordance with claim 1, disposed facing each other across a space for positioning a subject.

* * * * *